United States Patent
Tian et al.

(10) Patent No.: US 12,501,810 B2
(45) Date of Patent: Dec. 16, 2025

(54) DISPLAY PANEL AND DISPLAY APPARATUS

(71) Applicant: BOE Technology Group Co., Ltd., Beijing (CN)

(72) Inventors: Yu Tian, Beijing (CN); Tianhao Lu, Beijing (CN); Yang Li, Beijing (CN); Qian Jin, Beijing (CN); Qian Sun, Beijing (CN); Dejiang Zhao, Beijing (CN); Wei Huang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 492 days.

(21) Appl. No.: 18/020,629

(22) PCT Filed: Mar. 9, 2022

(86) PCT No.: PCT/CN2022/079874
§ 371 (c)(1),
(2) Date: Feb. 10, 2023

(87) PCT Pub. No.: WO2023/168617
PCT Pub. Date: Sep. 14, 2023

(65) Prior Publication Data
US 2024/0306465 A1    Sep. 12, 2024

(51) Int. Cl.
*H10K 59/38* (2023.01)
*H10K 59/122* (2023.01)
(Continued)

(52) U.S. Cl.
CPC .......... *H10K 59/38* (2023.02); *H10K 59/122* (2023.02); *H10K 59/35* (2023.02); *H10K 59/8731* (2023.02); *H10K 59/8792* (2023.02)

(58) Field of Classification Search
CPC ...... H10K 59/38; H10K 59/122; H10K 59/35; H10K 59/8731; H10K 59/8792;
(Continued)

(56) References Cited

U.S. PATENT DOCUMENTS

2018/0123074 A1* 5/2018 Lee .................. H10K 59/40
2019/0346719 A1* 11/2019 Li .................... G02F 1/13471
(Continued)

FOREIGN PATENT DOCUMENTS

CN     106932954 A    7/2017
CN     109244116 A    1/2019
(Continued)

*Primary Examiner* — S M Sohel Imtiaz
(74) *Attorney, Agent, or Firm* — Ling Wu; Stephan Yang; Ling and Yang Intellectual Property

(57) ABSTRACT

A display panel includes: a first base substrate; a light emitting device layer located at a side of the first base substrate, including three light emitting devices respectively located in three sub-pixels; a thin film encapsulation layer located at a side of the light emitting device layer away from the first base substrate; a color filter layer located at a side of the color conversion layer away from the first base substrate, and at least including a first light shielding pattern, a first color filter pattern and a second color filter pattern, wherein the first light shielding pattern defines a plurality of light transmitting areas; a color conversion layer located between the light emitting device layer and the color filter layer, and including a first color conversion pattern, a second color conversion pattern and a transmission pattern respectively located within three sub-pixels.

20 Claims, 6 Drawing Sheets

(51) Int. Cl.
*H10K 59/35* (2023.01)
*H10K 59/80* (2023.01)

(58) Field of Classification Search
CPC .... H10K 50/80; H10K 50/858; H10K 50/865; H10K 59/00; H10K 59/879
See application file for complete search history.

(56) References Cited

U.S. PATENT DOCUMENTS

| | | | |
|---|---|---|---|
| 2019/0371866 A1* | 12/2019 | Kim | H10K 59/879 |
| 2020/0303466 A1* | 9/2020 | Park | H10K 59/38 |
| 2021/0111363 A1* | 4/2021 | Hwang | H10K 50/125 |
| 2021/0193742 A1* | 6/2021 | Kim | H10K 59/38 |
| 2021/0265537 A1* | 8/2021 | Shin | H10K 59/12 |
| 2021/0273022 A1* | 9/2021 | Park | G02B 5/26 |
| 2021/0391390 A1* | 12/2021 | Yoon | H10K 59/879 |
| 2021/0399260 A1* | 12/2021 | Kim | H10K 59/8731 |
| 2021/0408476 A1* | 12/2021 | Choi | H10K 59/879 |
| 2022/0093707 A1* | 3/2022 | Lee | H10K 71/135 |
| 2022/0336780 A1* | 10/2022 | Sun | H10K 59/879 |

FOREIGN PATENT DOCUMENTS

| | | | |
|---|---|---|---|
| CN | 110544708 A | | 12/2019 |
| CN | 110727144 A | | 1/2020 |
| CN | 111653683 A | | 9/2020 |
| CN | 111725415 A | | 9/2020 |
| CN | 212517209 U | * | 2/2021 |
| CN | 113284929 A | | 8/2021 |
| CN | 113809130 A | | 12/2021 |
| CN | 113809262 A | | 12/2021 |
| CN | 113838993 A | | 12/2021 |
| JP | 2015-128027 A | | 7/2015 |

* cited by examiner

DISPLAY PANEL AND DISPLAY APPARATUS

CROSS-REFERENCE TO RELATED APPLICATION

This application is a national stage application of PCT Application No. PCT/CN2022/079874, which is filed on Mar. 9, 2022 and entitled "Display Panel and Display Apparatus", the content of which should be regarded as being incorporated herein by reference.

TECHNICAL FIELD

Embodiments of the present disclosure relate to, but are not limited to, the field of display technologies, and in particular, relate to a display panel and a display apparatus.

BACKGROUND

Quantum Dots-Organic Light Emitting Diodes (QD-OLED) is a new display device which uses OLED as excitation light source and QD as color conversion layer to realize full-color display.

SUMMARY

The following is a summary of subject matters described herein in detail. The summary is not intended to limit the protection scope of the application.

Embodiments of the present disclosure provide a display panel having a plurality of repeated pixel units, at least one pixel unit includes a first sub-pixel, a second sub-pixel and a third sub-pixel displaying different colors, wherein the display panel includes:

a first base substrate;
a light emitting device layer located at a side of the first base substrate, wherein the light emitting device layer includes a first light emitting device, a second light emitting device and a third light emitting device, the first light emitting device is located in the first sub-pixel, the second light emitting device is located in the second sub-pixel, the third light emitting device is located in the third sub-pixel, and the light emitting device layer includes an anode layer, an emitting layer, a cathode layer and a pixel definition layer;
a thin film encapsulation layer located at a side of the light emitting device layer away from the first base substrate;
a color filter layer located at a side of a color conversion layer away from the first base substrate, at least including a first light shielding pattern, a first color filter pattern and a second color filter pattern, the first light shielding pattern defines a plurality of light transmitting areas, and the light transmitting areas include a first light transmitting area corresponding to the first sub-pixel, a second light transmitting area corresponding to the second sub-pixel and a third light transmitting area corresponding to the third sub-pixel;
a color conversion layer located between the light emitting device layer and the color filter layer, wherein the color conversion layer includes a first color conversion pattern located in the first sub-pixel, a second color conversion pattern located in the second sub-pixel and a transmission pattern located in the third sub-pixel; and
a filler layer located between the light emitting device layer and the color conversion layer, wherein the filler layer includes a matrix having a positive refractive index and a plurality of optical patterns having a negative refractive index.

Embodiments of the present disclosure further provide a display apparatus, including a plurality of display panels according to the embodiments of the present disclosure described above.

Other aspects may be understood upon reading and understanding the drawings and detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

Figure 1:
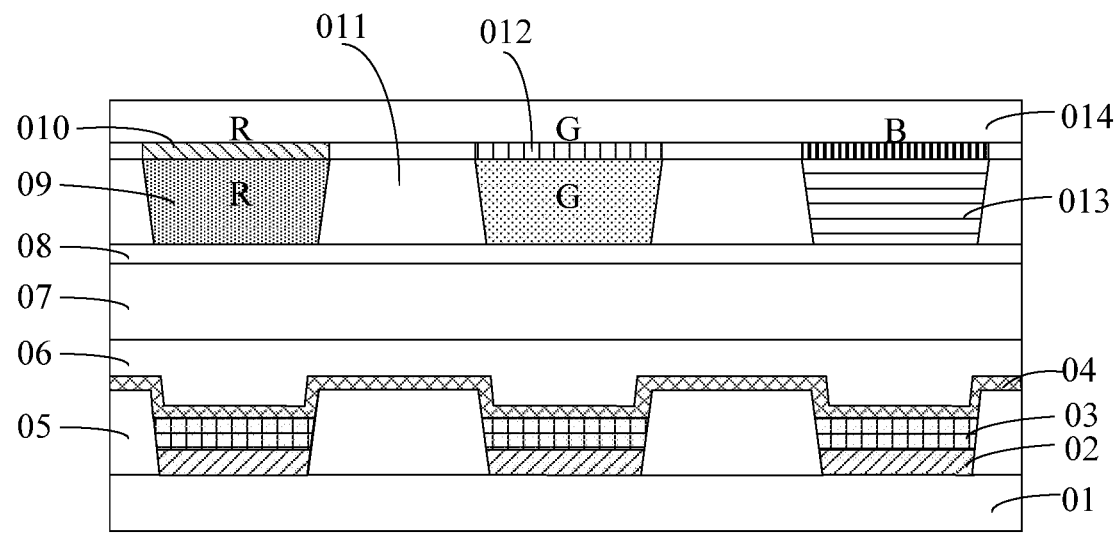
FIG. 1 is a schematic diagram of a typical structure of a display panel in a related art.

Meanings of reference signs in the accompanying drawings are as follows.

01—thin film transistor circuit layer; 02—anode; 03—light emitting functional layer; 04—cathode; 05—PDL layer; 06—first sub-encapsulation layer; 07—Filler layer; 08—second sub-encapsulation layer; 09—quantum dot conversion layer; 010—R/G/B color film layer; 011—Partition wall; 012—black matrix layer; 013—scatter structure layer; 014—substrate;

10—first base substrate; 20—light emitting device layer; LD1—first light emitting device; LD2—second light emitting device; LD3—third light emitting device; 21—anode layer; 22—emitting layer; 23—cathode layer; 24—pixel definition Layer; 241—first sub-pixel definition layer; 242—second sub-pixel definition layer; 30—thin film encapsulation layer; 31—first encapsulation layer; 32—second encapsulation layer; 33—third encapsulation layer; 40—filler layer; 41—matrix; 50—color conversion layer; 51—first color conversion pattern; 52—second color conversion pattern; 53—transmission pattern; 54—bank; 60—color filter layer; 61—first color filter pattern; 62—second color filter pattern; 63—first light shielding pattern; TA1—first light transmitting area; TA2—second light transmitting area; TA3—third light transmitting area; T1—first switch element; T2—second switch element; T3—third switch element; LA1—first light emitting area; LA2—second light emitting area; LA3—third light emitting area; NLA—non-light emitting area; 64—black matrix; 70—optical pattern; 71—first surface; 72—second surface; 73—side surface; 74—first optical pattern; 75—second optical pattern; 76—third optical pattern; 80—insulation layer; 90—first capping layer; 100—second cover layer; 110—second base substrate.

DETAILED DESCRIPTION

Implementations herein may be implemented in multiple different forms. Those of ordinary skills in the art can readily appreciate a fact that the implementations and contents may be varied into various forms without departing from the spirit and scope of the present disclosure. Therefore, the present disclosure should not be explained as being limited to contents described in following implementations only. The embodiments in the present disclosure and features in the embodiments may be combined randomly with each other without conflict.

In the accompanying drawings, a size of a constituent element, and a thickness of a layer or an area is sometimes exaggerated for clarity. Therefore, any one implementation mode of the present disclosure is not necessarily limited to dimensions shown in the drawings, and the shapes and sizes of the components in the accompanying drawings do not reflect actual scales. In addition, the accompanying drawings schematically show an ideal example, and any one implementation mode of the present disclosure is not limited to the shapes, values, or the like shown in the accompanying drawings.

In the description of the present disclosure, ordinal numerals such as "first" and "second" are set to avoid confusion of constituents, but not intended for restriction in quantity.

Based on QD color film, QD-OLED of cassette-to-cassette structure can achieve a display effect with high color gamut and high color purity. But in the QD-OLED of cassette-to-cassette structure, due to the existence of encapsulation layer and filler layer, there is a large thickness of cassette between the OLED emitting layer and the QD color film layer, however, there is no extra light blocking structure between adjacent sub-pixels except pixel definition layer (PDL) and black matrix (BM), so the excited light emitted by the light emitting functional layer is not guided optically, which is easy to cause crosstalk of emitted light between sub-pixels, resulting in side crosstalk of excited light in QD-OLED of cassette-to-cassette structure and reducing display gamut.

FIG. 1 is a schematic diagram of a typical structure of a display panel in a related art. As shown in FIG. 1, the display panel mainly includes a thin film transistor (TFT) circuit layer 01, a blue-light organic light emitting diode (blue-light OLED) with a top emission structure, and a quantum dot color film layer (QD color film layer); wherein, the TFT circuit layer is an OLED control circuit and power supply circuit, which controls OLED switch and the OLED drive current; the blue light OLED includes an anode 02, a light emitting functional layer 03, a cathode 04, a PDL layer 05 spacing apart sub-pixels of the light emitting functional layer, and a first sub-encapsulation layer 06; the blue light OLED emitting layer and the QD color film layer form a cassette-to-cassette structure through the filler layer 07; the QD color film layer includes a second sub-encapsulation layer 08, a quantum dot conversion layer 09 (including an R quantum dot conversion layer and a G quantum dot conversion layer), an R/G/B color film layer 010 (including an R color film, a G color film and a B color film), a partition wall 011, a black matrix layer 012 (BM layer), a scatter structure layer 013 formed by scatter particles provided in the blue pixel area, and a substrate 014. The main function of QD color film is to convert excited blue light into red light and green light, and realize full-color display together with blue light. QD material is located in the light emitting area of each sub-pixel. Red quantum dots (QD-R) in red quantum dot conversion layer can convert blue light into red light, green quantum dots (QD-G) in green quantum dot conversion layer can convert blue light into green light, and the scatter structure layer can enhance blue light emission.

Figure 2:
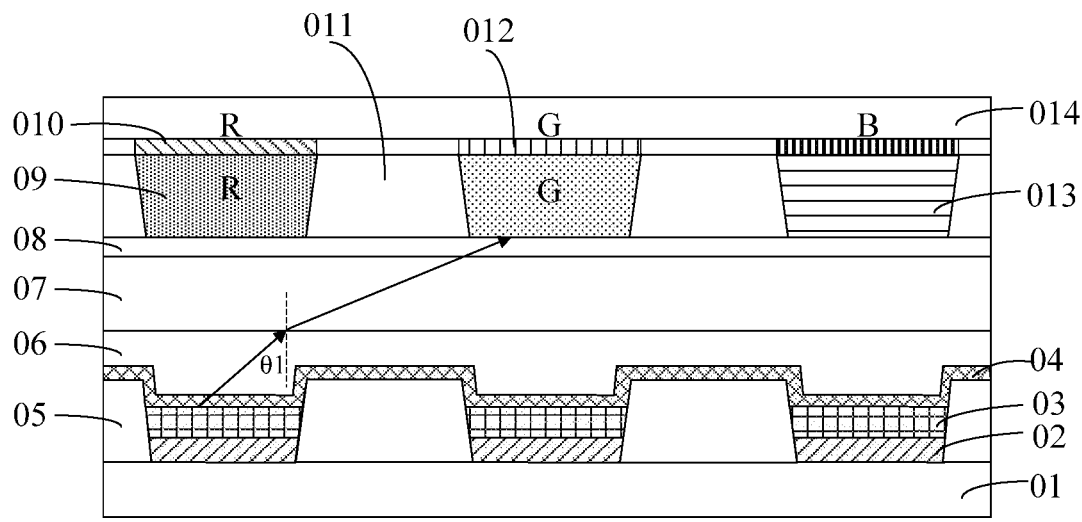
FIG. 2 is a schematic diagram showing side crosstalk of excited light in a typical structure of the display panel in FIG. 1.

FIG. 2 is a schematic diagram showing side crosstalk of excited light in a typical structure of the display panel in FIG. 1. Taking R sub-pixel as an example, there are various situations for emitted light, here the following special case are taken as the example: when the light is emitted at a large angle θ 1 in FIG. 2, the light reaches the filler layer 70 and is positively refracted (the incident light and the refracted light are located on the opposite side of the normal), and θ 1 is less than the critical angle, so there is no total reflection between the two media, but the emitted light continues to emit upward in the illustrated direction, crossing the partition wall 011 of the sub-pixels, and excites the G color sub-pixels in the figure to emit light and results in crosstalk.

Embodiments of the present disclosure provide a display panel having a plurality of repeated pixel units, at least one pixel unit includes a first sub-pixel, a second sub-pixel and a third sub-pixel displaying different colors, wherein the display panel includes:

a first base substrate;
a light emitting device layer located at a side of the first base substrate, wherein the light emitting device layer includes a first light emitting device, a second light emitting device and a third light emitting device, the first light emitting device is located in the first sub-pixel, the second light emitting device is located in the second sub-pixel, the third light emitting device is located in the third sub-pixel, and the light emitting device layer includes an anode layer, an emitting layer, a cathode layer and a pixel definition layer;
a thin film encapsulation layer located at a side of the light emitting device layer away from the first base substrate;
a color filter layer located at a side of a color conversion layer away from the first base substrate, at least including a first light shielding pattern, a first color filter pattern and a second color filter pattern, the first light shielding pattern defines a plurality of light transmitting areas, and the light transmitting areas include a first light transmitting area corresponding to the first sub-pixel, a second light transmitting area corresponding to the second sub-pixel and a third light transmitting area corresponding to the third sub-pixel;

a color conversion layer located between the light emitting device layer and the color filter layer, wherein the color conversion layer includes a first color conversion pattern located in the first sub-pixel, a second color conversion pattern located in the second sub-pixel and a transmission pattern located in the third sub-pixel; and a filler layer located between the light emitting device layer and the color conversion layer, wherein the filler layer includes a matrix having a positive refractive index and a plurality of optical patterns having a negative refractive index.

The following equations can be derived from Maxwell equations:

$$\vec{k} \times \vec{E} = \omega\mu\vec{H}$$

$$\vec{k} \times \vec{H} = -\omega\varepsilon\vec{E}$$

$$\vec{k} \times \vec{E} = 0 \vec{k} \times \vec{H} = 0$$

where k is the phase velocity direction of the electromagnetic wave; E is the electric field; H is the magnetic field; ω is the frequency of electromagnetic wave; μ is the permeability; ε is the dielectric constant.

It can be seen that E, H and k meet the right-handed screw relationship, and such medium is usually called "right-handed material". However, if one of μ and ε for the media is positive and the other is negative, then k is less than zero and k has no real solution, that is, the above equation has no real solution, and electromagnetic waves cannot propagate in this media. If both μ and ε for the medium are less than zero, the above equation has a real solution, and electromagnetic waves can propagate in this media, E, H and k no longer satisfy the right-handed screw relationship, but satisfy the left-handed screw relationship. Therefore, this medium is called "left-handed material".

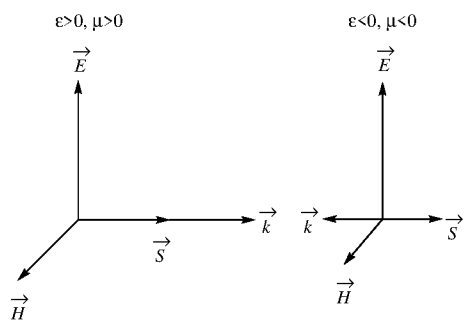

In "left-handed material", k, which represents the phase velocity direction of electromagnetic wave, is opposite to Poynting vector S. k=−ω√με is negative, the refractive index of the medium is also negative, so this medium is also called "negative refractive index material".

Figure 3:
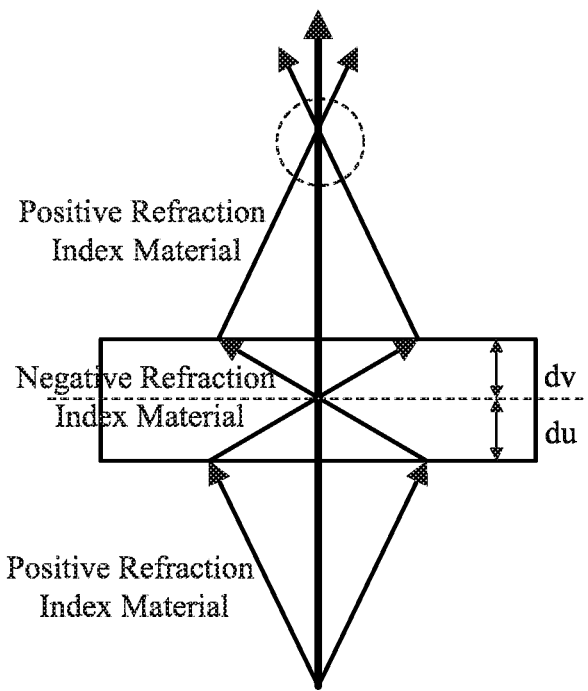
FIG. 3 is a schematic diagram of a light focus effect of a negative refractive index material in a flat plate shape.

From Maxwell's equation describing the relationship between magnetic field and electric field, it can be concluded that microwave radiation or light in "left-handed materials" will present the opposite effect: usually, the lens divergence of electromagnetic radiation is concentrated in this combined material instead. Therefore, when the incident light passes through the contact surface between the general medium and the "left-handed material", the deflection direction of the refracted light will be at the same side of the normal as the incident light. Left-handed materials in flat plate shape will have a light focus effect similar to that of ordinary convex lenses. FIG. 3 is a schematic diagram of a light focus effect of a negative refractive index material ("left-handed material") in a flat plate shape.

Therefore, a plurality of optical patterns with negative refractive index are disposed in the filler layer of the display panel according to the embodiment of the present disclosure, which can obtain a light focus effect, thereby blocking the interference of large-angle excited light to adjacent pixels to a certain extent, improving the side crosstalk problem to the QD-OLED of cassette-to-cassette structure, and improving the display color gamut.

In an exemplary embodiment of that present disclosure, the thin film encapsulation layer is positioned at a side of the light emitting device layer close to the color conversion layer, and includes a first encapsulation layer, a second encapsulation layer and a third encapsulation layer which are sequentially stacked along a direction close to the first base substrate, wherein the first encapsulation layer and the third encapsulation layer are inorganic encapsulation layers and the second encapsulation layer is an organic encapsulation layer, wherein the material of the first encapsulation layer has a positive refractive index.

In exemplary embodiments of the present disclosure, the optical pattern may have a side surface in direct contact with the matrix.

In an exemplary embodiment of the present disclosure, the optical pattern may also have a first surface and a second surface connected with the side surface, the second surface is parallel to a plane where the first base substrate is located and is in direct contact with the matrix.

In an exemplary embodiment of the present disclosure, the first surface is parallel to the plane where the first base substrate is located and in direct contact with the matrix. In an exemplary embodiment of the present disclosure the optical pattern may have a side surface, a first surface and a second surface in direct contact with the matrix.

In an exemplary embodiment of the present disclosure, the first surface may be parallel to a plane where the first base substrate is located, and the first surface of the optical pattern is located at a side of the optical pattern close to the first base substrate, and the first surface of the optical pattern is in direct contact with a surface at a side of the first encapsulation layer away from the first base substrate.

Figure 4:
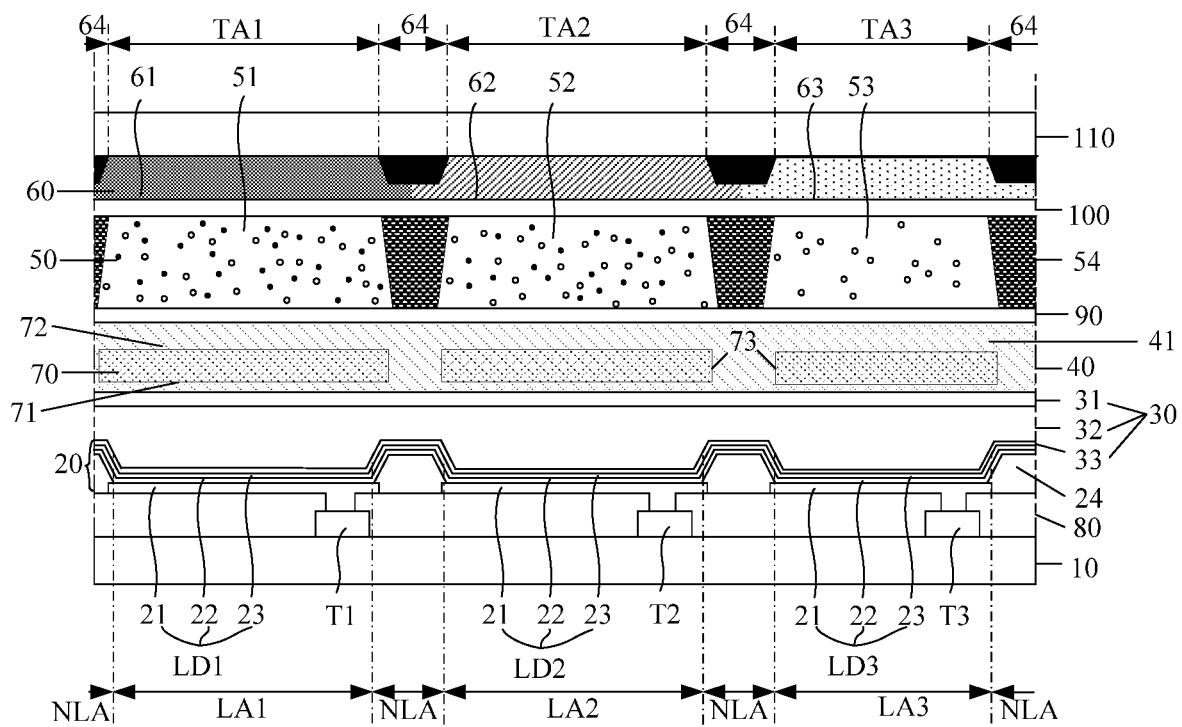
FIG. 4 is a schematic diagram of a structure of a display panel according to an exemplary embodiment of the present disclosure.

FIG. 4 is a schematic diagram of a structure of a display panel according to an exemplary embodiment of the present disclosure. As shown in FIG. 4, the display panel includes a first base substrate 10, a light emitting device layer 20, a thin film encapsulation layer 30, a filler layer 40, a color conversion layer 50 and a color filter layer 60.

The light emitting device layer 20 is positioned at a side of the first base substrate 10, the light emitting device layer 20 includes a first light emitting device LD1 located within a first sub-pixel, a second light emitting device LD2 located within a second sub-pixel, and a third light emitting device LD3 located within a third sub-pixel; the light emitting device layer 20 includes an anode layer 21, an emitting layer 22, a cathode layer 23 and a pixel definition layer 24, the anode layer 21 is located at a side of the first base substrate 10, the emitting layer 22 is located at a side of the anode layer 21 away from the first base substrate 10, the cathode layer 23 is located at a side of the emitting layer 22 away from the first base substrate 10, and the pixel definition layer 24 spaces apart the first light emitting device LD1, the second light emitting device LD2 and the third light emitting device LD3 of the light emitting device layer 20.

The thin film encapsulation layer 30 is located at a side of the light emitting device layer 20 away from the first base substrate 10 and includes a first encapsulation layer 31, a second encapsulation layer 32 and a third encapsulation layer 33 that are sequentially stacked along a direction close to the first base substrate. The first encapsulation layer 31 and the third encapsulation layer 33 are inorganic encapsulation layers, and the second encapsulation layer 32 is an organic encapsulation layer.

The filler layer 40 is located at a side of the thin film encapsulation layer 30 away from the first base substrate 10, the filler layer 40 includes a matrix 41 having a positive refractive index and a plurality of optical patterns 70 having a negative refractive index; the optical pattern 70 has a side surface 73 that is in direct contact with the matrix 41 i.e. a surface of the optical pattern 70 that can intersect a plane parallel to the first base substrate as shown in FIG. 4; the optical pattern also has a first surface 71 and a second surface 72 in direct contact with the matrix 41.

The color conversion layer 50 is located at a side of the filler layer 40 away from the first base substrate 10, the color conversion layer 50 includes a first color conversion pattern 51, a second color conversion pattern 52, a transmission pattern 53, and a bank 54 spacing apart the first color conversion pattern 51, the second color conversion pattern 52 and the transmission pattern 53, the first color conversion pattern 51 is located in the first sub-pixel, the second color conversion pattern 52 is located in the second sub-pixel, and the transmission pattern 53 is located in the third sub-pixel.

The color filter layer 60 is located at a side of the color conversion layer 50 away from the first base substrate 10 and at least includes a first color filter pattern 61, a second color filter pattern 62 and a first light shielding pattern 63 (i.e., a red color filter pattern and a green color filter pattern, a blue color filter pattern may be omitted, and the light shielding pattern may be made using a blue color filter pattern), the first light shielding pattern 63 defines a plurality of light transmitting areas including a first light transmitting area TA1 corresponding to the first sub-pixel, a second light transmitting area TA2 corresponding to the second sub-pixel and a third light transmitting area TA3 corresponding to the third sub-pixel; the color filter layer 60 also includes a black matrix (BM) 64 spaces apart different sub-pixels.

In an exemplary embodiment of the present disclosure, as shown in FIG. 4, the display panel may also include a plurality of switch elements located on the first base substrate 10. In one repeat unit of the light emitting area, the switch elements include a first switch element T1, a second switch element T2, and a third switch element T3. For example, the first switch element T1 may be located in the first light emitting area LA1, the second switch element T2 may be located in the second light emitting area LA2, and the third switch element T3 may be located in the third light emitting area LA3. For another example, at least one of the first switch element T1, the second switch element T2 and the third switch element T3 may be located in the non-light emitting area NLA. At least one of the first switch element T1, the second switch element T2, and the third switch element T3 may be a thin film transistor including polysilicon or a thin film transistor including an oxide semiconductor. For example, when the switch element is a thin film transistor including an oxide semiconductor, it may be a thin film transistor structure with a top gate. The switch element may be connected with a signal line, and signal line includes, but not limited to, a gate line, a data line and a power supply line.

In an exemplary embodiment of the present disclosure, the display panel may further include an insulation layer 80, which may be located on the first switch element T1, the second switch element T2 and the third switch element T3. The insulation layer 80 may have a planarized surface. The insulation layer 80 may be formed of an organic layer. For example, the insulation layer 80 may include an acrylic resin, an epoxy resin, an imide resin, or an ester resin. The insulation layer 80 may have through holes to expose the electrodes of the first switch element T1, the second switch element T2 and the third switch element T3 to facilitate electrical connection.

In an exemplary embodiment of the present disclosure, as shown in FIG. 4, the display panel may further include a first capping layer 90 between the filler layer 40 and the color conversion layer 50, and a second capping layer 100 between the color conversion layer 50 and the color filter layer 60. Quantum dots may react with water and/or oxygen to deteriorate, therefore, aiming at preventing or reducing the penetration of water and/or oxygen into the color conversion layer, the provision of a capping layer surrounding the color conversion layer can effectively prevent or reduce the occurrence of degradation of light emitting efficiency and defects that may be caused by the penetration of water and/or oxygen into the color conversion layer. The first capping layer 90 and the second capping layer 100 may be an inorganic material layer, for example, the material of the first capping layer 90 may be silicon oxynitride (SiON) with a refractive index of 1.8 and a thickness of 1 μm.

In an exemplary embodiment of the present disclosure, as shown in FIG. 4, the display panel may further include a second substrate 110 located at a side of the color filter layer 60 away from the first base substrate.

In an exemplary embodiment of the present disclosure, as shown in FIG. 4, the display panel may further include an insulation layer 80, a first capping layer 90, a second capping layer 100 and a second base substrate 110.

In an exemplary embodiment of the present disclosure, the optical pattern may have a first surface in direct contact with the first encapsulation layer, and the optical pattern may have a second surface and a side surface in direct contact with the matrix.

Figure 5:
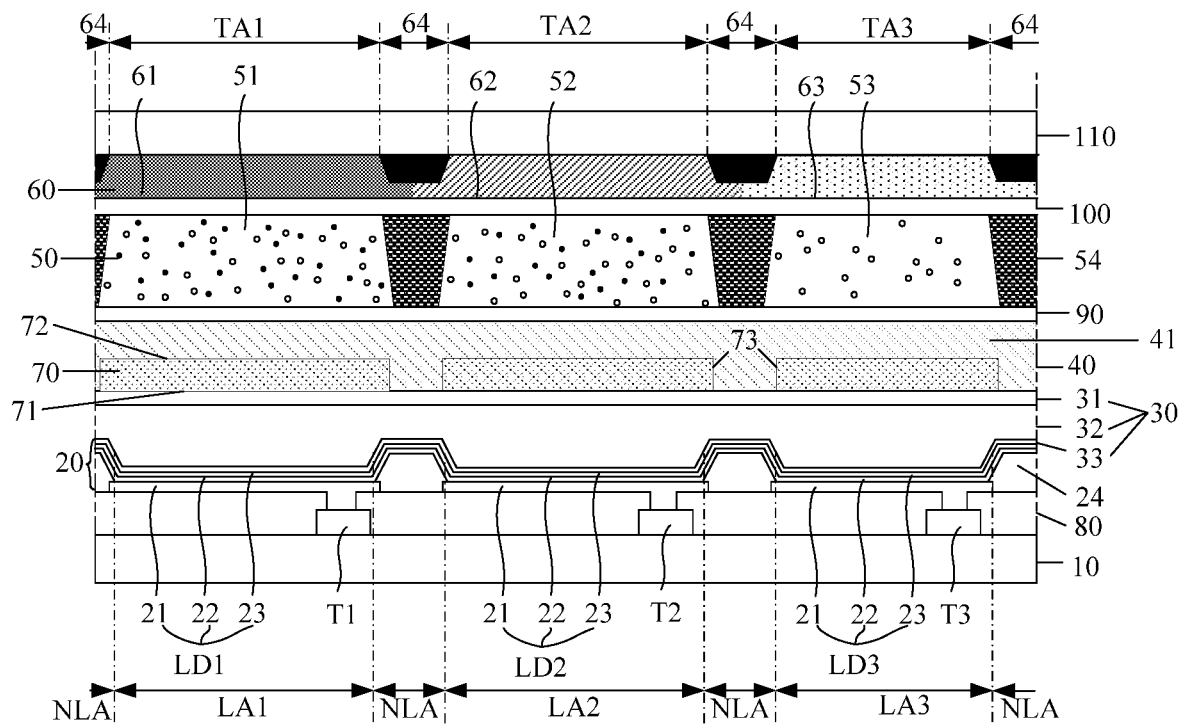
FIG. 5 is a schematic diagram of a structure of a display panel according to another exemplary embodiment of the present disclosure.

FIG. 5 is a schematic diagram of a structure of a display panel according to another exemplary embodiment of the present disclosure. As shown in FIG. 5, in an exemplary embodiment of the present disclosure, wherein the material of the first encapsulation layer 31 has a positive refractive index; the optical pattern 70 has a first surface 71 in direct contact with the first encapsulation layer 31, and the optical pattern 70 has a second surface 72 and a side surface 73 in direct contact with the matrix 41. Since the optical pattern has a negative refractive index and the first encapsulation layer has a positive refractive index, the light can be deflected to the opposite direction at the interface where the first surface is in direct contact with the first encapsulation layer, so that the light can better propagate in the expected direction.

In an exemplary embodiment of that present disclosure, as shown in FIG. 5, the first surface 71 of the optical pattern 70 may be parallel to the first base substrate 10 and is located at a side of the optical pattern 70 close to the first base substrate 10, the entire first surface is in direct contact with a surface at a side of the first encapsulation layer 31 away from the first base substrate 10.

In an exemplary embodiment of the present disclosure, the optical pattern may be a flat plate shape, and both the first surface 71 and the second surface 72 of the optical pattern are parallel to the plane where the first base substrate is located.

In an exemplary embodiment of the present disclosure, a plurality of the optical patterns 70 may be sequentially arranged along a first direction and extend along a second direction, and the first direction intersects with the second direction.

In the description of the present disclosure, the "first direction" is an arrangement direction of the light emitting devices from the first light emitting device LD1 to the third light emitting device LD3, and the "second direction" is a direction that intersects with the first direction, and the first direction may be perpendicular to the second direction.

In an exemplary embodiment of the present disclosure, orthographic projection areas of the first light transmitting area TA1, the second light transmitting area TA2 and the third light transmitting area TA3 in the filler layer 40 may each be provided with at least one optical pattern 70.

Figure 6:
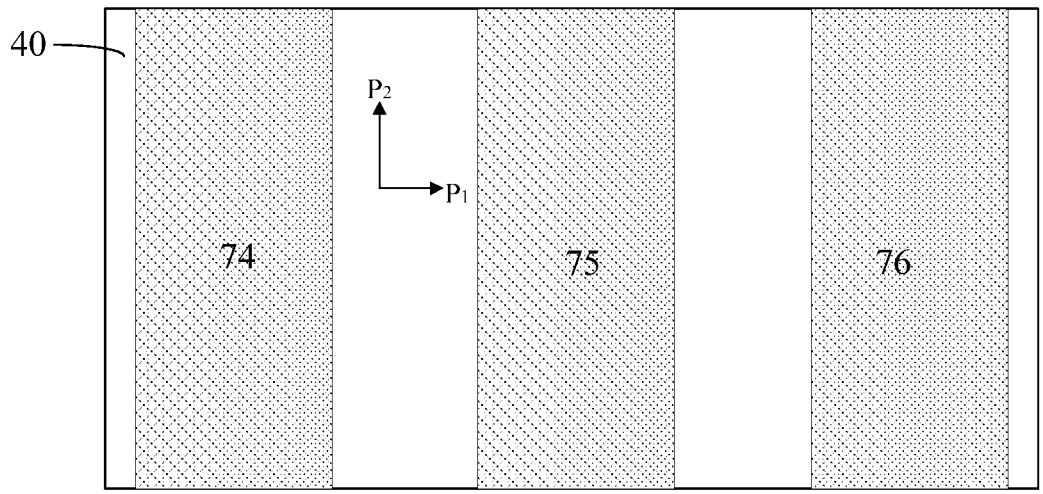
FIG. 6 is a planar schematic diagram of a display panel according to another exemplary embodiment of the present disclosure.

FIG. 6 is a planar schematic diagram of a display panel according to another exemplary embodiment of the present disclosure. In an exemplary embodiment of the present disclosure, as shown in FIG. 5 and FIG. 6, in an exemplary embodiment of the present disclosure, the optical pattern 70 may include a first optical pattern 74, a second optical pattern 75 and a third optical pattern 76, An orthographic projection of the first optical pattern 74 on the first base substrate 10 is substantially overlapped with an orthographic projection of the first light transmitting area TA1 on the first base substrate 10, an orthographic projection of the second optical pattern 75 on the first base substrate 10 is substantially overlapped with an orthographic projection of the second light transmitting area TA2 on the first base substrate 10, and an orthographic projection of the third optical pattern 76 on the first base substrate 10 is substantially overlapped with an orthographic projection of the third light transmitting area TA3 on the first base substrate 10; the first optical pattern 74, the second optical pattern 75 and the third optical pattern 76 are sequentially arranged along a first direction P1, and each of the first optical pattern 74, the second optical pattern 75 and the third optical pattern 76 extends along a second direction P2, the first direction P1 is perpendicular to the second direction P2.

Figure 7:
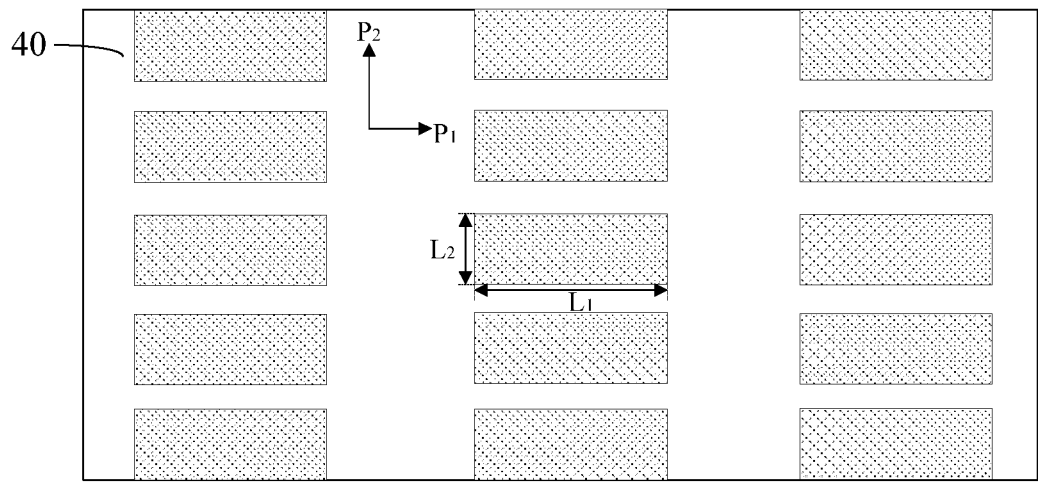
FIG. 7 is a schematic diagram of a structure of a display panel according to yet another exemplary embodiment of the present disclosure.

In an exemplary embodiment of the present disclosure, the plurality of optical patterns may be distributed in the filler layer in an array. FIG. 7 is a schematic diagram of a structure of a display panel according to yet another exemplary embodiment of the present disclosure in which L1 denotes the length of a long edge of the optical pattern and L2 denotes the length of a short edge of the optical pattern. As shown in FIG. 7, a plurality of optical patterns may be distributed in an array along the first direction P1 and the second direction P2 intersecting with each other on a plane parallel to the first base substrate in the filler layer 40. The first direction P1 may be perpendicular to the second direction P2.

In an exemplary embodiment of the present disclosure, as shown in FIG. 6, the optical patterns within sub-pixels of the same color may be continuous in the second direction; alternatively, as shown in FIG. 7, the optical patterns within sub-pixels of the same color may be discontinuous in the second direction.

Figure 8:
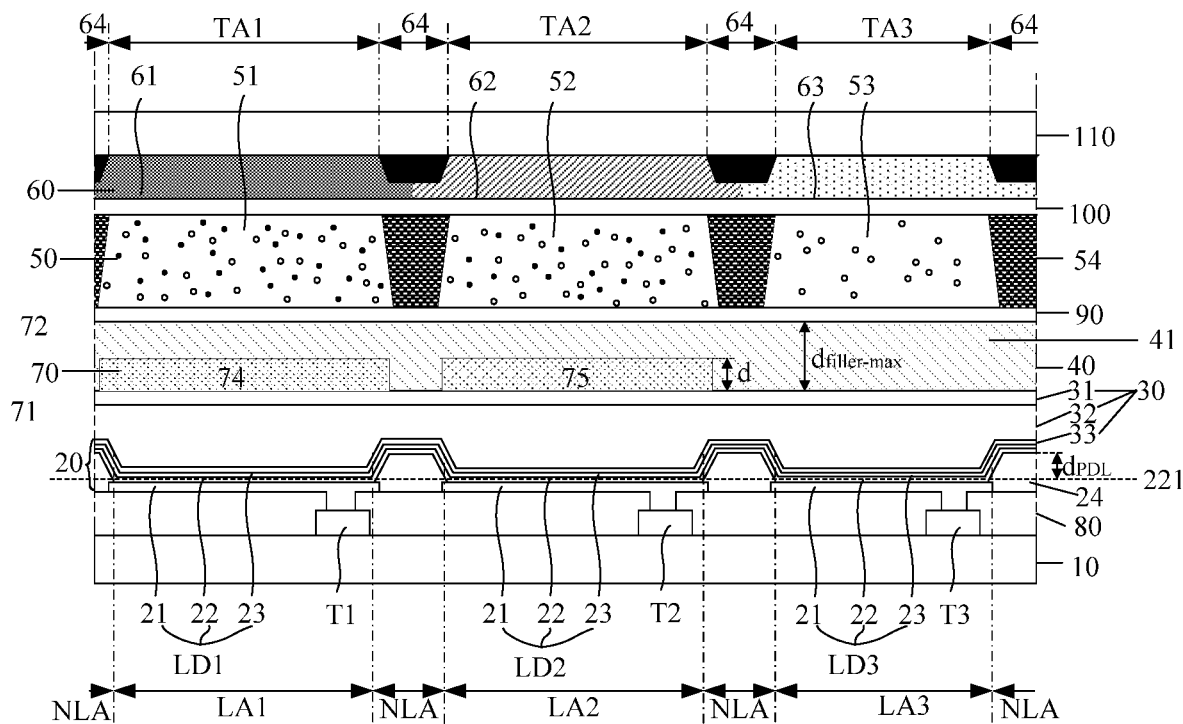
FIG. 8 is a schematic diagram of a structure of a display panel according to yet another exemplary embodiment of the present disclosure.

FIG. 8 is a schematic diagram of a structure of a display panel according to yet another exemplary embodiment of the present disclosure, as shown in FIG. 8, in a repeated pixel unit, two optical patterns 70 may be provided as a first optical pattern 74 and a second optical pattern 75, an orthographic projection of the first optical pattern 74 on the first base substrate 10 is substantially overlapped with an orthographic projection of the first light transmitting area TA1 on the first base substrate 10, and an orthographic projection of the second optical pattern 75 on the first base substrate 10 is substantially overlapped with an orthographic projection of the second light transmitting area TA2 on the first base substrate 10; the color of the sub-pixel of the third light transmitting area TA3 is the same as the color of the light emitted by the light emitting device of the light emitting device layer.

For example, when all the light emitting devices of the light emitting device layer emit blue light, there is no need to provide a blue conversion pattern in the color conversion layer 50 layer, and there is no need to worry about the color crosstalk at the transmission pattern 53, so that the optical pattern in the filler layer 40 in the third light transmitting area displaying blue can be omitted.

As shown in FIG. 5 and FIG. 8, two or three optical patterns 70 may be provided in one repeated pixel unit. In other exemplary embodiments, more than three optical patterns 70 may be provided in one repeated pixel unit. Preferably, at least three optical patterns 70 are provided in one repeated pixel unit.

In an exemplary embodiment of the present disclosure, the colors of the emitted light of the first light emitting device, the second light emitting device and the third light emitting device emit the same color.

According to the theory of negative refraction, flat lens with different effective refractive index has different imaging object distance range, and special design to effective refractive index can break through the limit of the object distance of flat lens. At the same time, the effective refractive index of the flat lens can be controlled by its material parameters or structural parameters (such as thickness, etc.).

In an exemplary embodiment of the present disclosure, as shown in FIG. 8, a thickness d of the optical pattern along a direction perpendicular to the first base substrate may be less than a maximum thickness dfiller-max of the filler layer along the direction perpendicular to the first base substrate. Since the optical pattern has negative refractive index, while the filler layer usually has a positive refractive index, when the thickness of the optical pattern along the direction perpendicular to the first base substrate is less than the maximum thickness of the filler layer along the direction perpendicular to the first base substrate, the first surface or the second surface of the optical pattern can be in direct contact with the matrix of the filler layer, and at the interface where the first surface or the second surface of the optical pattern is in direct contact with the matrix, the light can be deflected to the opposite direction, so that the light can better propagate in the expected direction.

Figure 9:
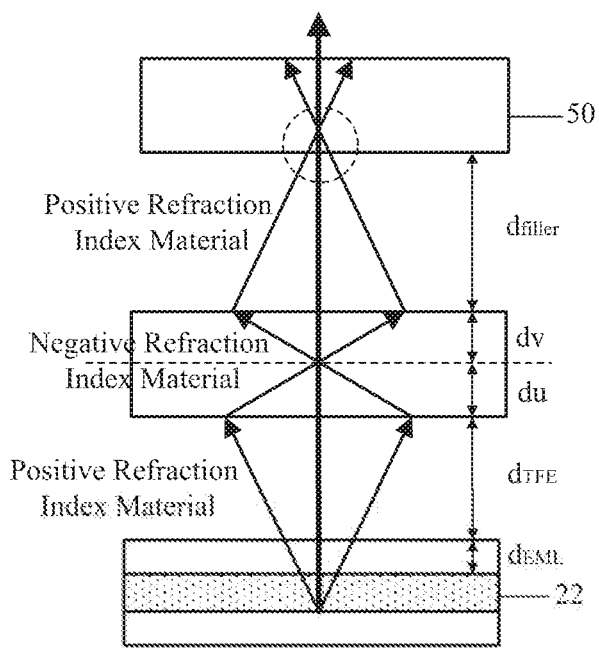
FIG. 9 is an analog optical path diagram of a classical perfect lens incorporating a display panel structure according to an exemplary embodiment of the present disclosure.

FIG. 9 is an analog optical path diagram of a classical perfect lens incorporating a display panel structure according to an exemplary embodiment of the present disclosure.

The thickness of the optical pattern can be obtained by simulation calculation combined with FIG. 9 and the film structure of the display panel. The formula involved is as follows:

Formula of lens focal length:

$$1/f = (n-1)\left[1/L1 - 1/L2 + (n-1)d/nL1L2\right] \qquad (1)$$

Relationship between focal length and object distance and image distance:

$$1/f = 1/u + 1/v \quad (2)$$
$$d = dv + du \quad (3)$$
$$u = du + dEML + DTFE \quad (4)$$
$$v = dfiller + dv \quad (5)$$

where d is the thickness of the optical pattern; f is a focal length; n is a refractive index of the optical pattern; L1 and L2 are lengths of a long edge and a short edge of the optical pattern respectively; u is an object distance; v is an image distance; dv is a distance from a light convergence point in the optical pattern to the second surface of the optical pattern along the direction perpendicular to the first base substrate; du is a distance from the light convergence point in the optical pattern to the first surface of the optical pattern along the direction perpendicular to the first base substrate; dEML is a distance from a center of the emitting layer to a surface at a side of the thin film encapsulation layer close to the first base substrate along the direction perpendicular to the first base substrate; dTFE is a thickness of the film encapsulation layer; dfiller is a distance between the second surface at a side of the optical pattern away from the first base substrate and a surface at a side of the color conversion layer close to the first base substrate.

In an exemplary embodiment of the present disclosure, the long edge L1 and the short edge L2 of the optical pattern are approximately equal to the size of the sub-pixel. By putting L1, L2, n, u, v, dEML, dTFE and dfiller into formulas (1)-(5), the thickness of optical pattern can be obtained.

Taking a 50 μm*50 μm pixel (L1 is about 50 μm, L2 is about 50 μm), with refractive index n=−2, μ=20 μm, v=18 μm as an example, the thickness of optical pattern is about 50 μm. Therefore, when the thickness of the optical pattern is about 50 μm, the bottom light can converge to the color conversion layer through the optical pattern and achieve the anti-crosstalk effect; in addition, the thickness of the optical pattern can be reduced by increasing the refractive index n (absolute value increase) and decreasing the size of pixel (high resolution), thus realizing optical adjustment. Applicable scenes are high-end displays with increased resolution and thinned display screen. On the contrary, the lower the resolution, the greater the thickness of the required optical pattern, and the more difficult it is to achieve the above effect.

In an exemplary embodiment of the present disclosure, the refractive index of the optical pattern may be 1 to 4.

In an exemplary embodiment of the present disclosure, f may be 5 to 15 while L1 may be 20 to 300 and L2 may be 20 to 300.

In an exemplary embodiment of the present disclosure, u may be 7 to 30 and v may be 7 to 30.

In an exemplary embodiment of that present disclosure, as shown in FIG. 8, the center position of the emitting layer 22 is located in a first plane 221 parallel to the first base substrate, and the distance dPDL from a surface of the pixel definition layer 24 away from the first base substrate to the first plane 221 along the direction perpendicular to the first base substrate may be not less than 200 nm, for example, may be 200 nm to 800 nm, and for another example, may be 200 nm, 300 nm, 400 nm, 500 nm, 600 nm, 700 nm, 800 nm.

The problem of side crosstalk of excited light can be further avoided by controlling the distance between the surface of the pixel definition layer away from the first base substrate and the first plane along the direction perpendicular to the first base substrate.

In an exemplary embodiment of that present disclosure, the pixel definition layer may be disposed as a multi-layer structure including a plurality of sub-pixel definition layers to increase the height of the pixel definition layer, thereby controlling the distance between the surface of the pixel definition layer away from the first base substrate and the first plane along the direction perpendicular to the first base substrate. For example, the pixel definition layer may include two, three, four, or more sub-pixel definition layers.

Figure 10:
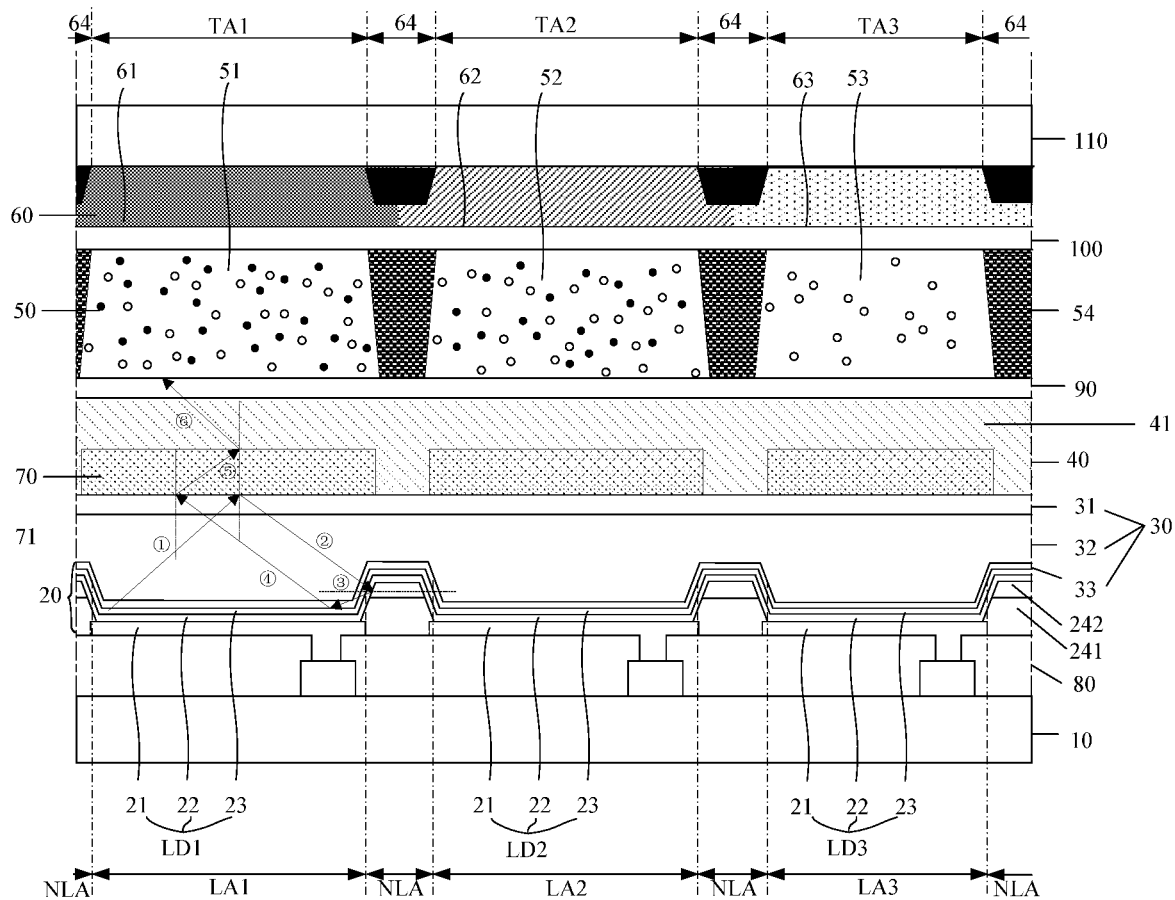
FIG. 10 is a schematic diagram of a structure of a display panel having a two-layer structure of pixel definition layer according to an exemplary embodiment of the present disclosure.

In the exemplary embodiment of the present disclosure, FIG. 10 is a schematic diagram of a structure of a display panel having a two-layer structure of pixel definition layer according to an exemplary embodiment of the present disclosure. As shown in FIG. 10 in the present exemplary embodiment, the pixel definition layer 24 includes a first sub-pixel definition layer 241 and a second sub-pixel definition layer 242, and the second sub-pixel definition layer 242 is disposed at a side of the first sub-pixel definition layer 241 away from the first base substrate 10.

In other embodiments, the pixel definition layer may include a structure with at least three layers, for example, may include a structure with three or four layers.

In an exemplary embodiment of the present disclosure, after forming a pixel definition layer of a multi-layer structure, a thin film metal layer may be formed at a sidewall of the pixel definition layer using Open Mask evaporation for an evaporation cathode to reflect or absorb a crosstalk problem caused by a segment difference portion.

In exemplary embodiments of the present disclosure, the filler layer may be an organic filler layer that functions as a flattening, bonding back plate and cover plate.

In an exemplary embodiment of the present disclosure, the thin film encapsulation layer of the display panel may have a triple-layer stacked encapsulation structure, that is, the thin film encapsulation layer includes the first encapsulation layer, the second encapsulation layer and the third encapsulation layer, the first encapsulation layer and the third encapsulation layer may be inorganic encapsulation layers, and the second encapsulation layer may be an organic encapsulation layer. The material of the first encapsulation layer may be silicon nitride (SiNx) with a refractive index of 1.85 to 1.9 (e.g. may be 1.85 or 1.9) and a thickness of 0.6 μm; the second encapsulation layer may be an acrylic organic layer, for example, may be an acrylic organic layer with a refractive index of 1.45 to 1.5 and a thickness of 8 to 10 μm (e.g. may be 8.4 μm), and may be formed by an ink-jet printing (IJP) process; the material of the third encapsulation layer may be silicon oxynitride (SiON) with a refractive index of 1.70 to 1.8 (e.g., may be 1.70, 1.75 or 1.8) and a thickness of 0.6 μm to 1 μm (e.g., may be 1 μm).

Figure 11:
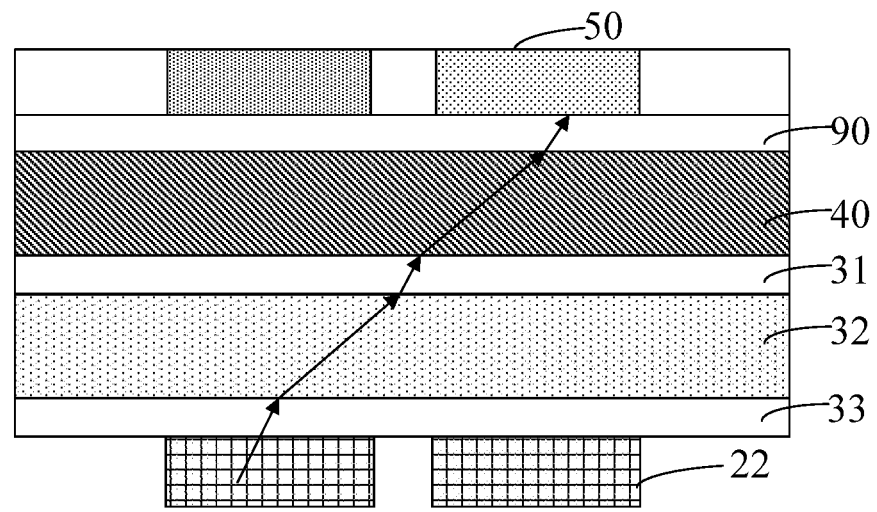
FIG. 11 is a schematic diagram showing side crosstalk of excited light of a display panel in which the thin film encapsulation layer has a triple-layer stacked encapsulation structure.

FIG. 11 is a schematic diagram showing side crosstalk of excited light of a display panel in which the thin film encapsulation layer has a triple-layer stacked encapsulation structure. The filler layer 40 is formed of an organic material with a refractive index of 1.6 and a thickness of 8. m; the first encapsulation layer 31 has a refractive index of 1.8, a material of SiON, and a thickness of 1 μm; the first encapsulation layer 31 has a refractive index of 1.85, a material of SiNx, and a thickness of 0.6 μm; the second encapsulation layer 32 has a refractive index of 1.5, is made of an acrylic organic material, and has a thickness of 8.4 μm; the third encapsulation layer 33 has a refractive index of 1.75, a material of SiON, and a thickness of 1 μm; the first capping layer 90 has a refractive index of 1.8, a material of SiON, and a thickness of 1 μm. As shown in FIG. 11, there may be a side crosstalk occurred in the excited light of the display panel of the triple-layer stacked encapsulation structure. However, with the scheme of the present disclosure, for example, setting the pixel definition layer as a multi-layer structure, this problem can be improved by preventing side crosstalk of excited light with an emitting angle of 31° to 56°

| Emitting angle range of excited light | Cross color angle | Obtaining angle of target pixel |
| --- | --- | --- |
| 0° to 56° (limited by SiON-IJP total reflection interface) | 31° to 56° | 0° to 31° |

Figure 12:
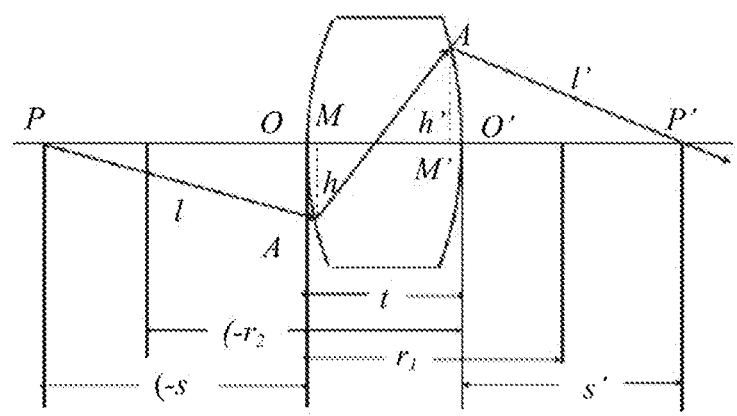
FIG. 12 is an optical path diagram of a negative refraction thin film lens.

FIG. 12 is an optical path diagram of a negative refraction thin film lens. Optical proof of negative refraction thin film lens is carried out with reference to FIG. 12.

Let the rule of sign be consistent with the lens imaging of positive refractive index medium. We consider the imaging under paraxial conditions. In FIG. 12, r1 and r2 are two radii of curvature of the thin lens; t is the thickness of the lens; n (n<0) is the refractive index of the lens; n1 and n2 (n1, n2>0) are the refractive indices on both sides of the lens; there is a light source P on the main axis, and a PA light emitted from P is refracted by a lens and then intersects with P at point P' on the main axis, thus $$\overline{OP} = -s, \overline{O'P} = s', \overline{PA} = l, \overline{A'P'} = l', \overline{AM} = h, \overline{A'M'} = h'$$

thereby bringing the following:

$$l = \left[(-s + \overline{OM})^2 + h^2\right]^{\frac{1}{2}} \quad (6)$$

$$l' = \left[(s' + \overline{O'M'})^2 + h^2\right]^{\frac{1}{2}}$$

and the optical path of any optical fiber PAA'P' can be expressed as:

$$\Delta = (PAA'P') = n_1 l + n(t - \overline{OM} - \overline{O'M'}) + n_2 l'; \quad (7)$$

if the paraxial condition is satisfied during imaging, there is $\overline{OM} \leq r_1$, $\overline{O'M'} \leq (-r_2)$; using geometric relations, approximate can be obtained as $$\overline{OM} \approx \frac{h^2}{2r_1}, \overline{O'M'} \approx \frac{h^2}{2(-r_2)}.$$

According to Fermat's principle $$\frac{d\Delta}{dh} = \frac{d(PAA'P')}{dh} = 0,$$

and considering that h is far less than the radius of curvature, h2 term is omitted, and l=−s, l'=s'. Then the formula of anomalous imaging thin lens can be obtained:

$$\frac{n_2}{s'} - \frac{n_1}{s} = \frac{n - n_1}{r_1} + \frac{n_2 - n}{r_2} \quad (8)$$

Meanwhile, the object focal length and image focal length of the thin lens can be obtained as follows:

$$f = \lim_{s' \to \infty} s = -n_1 / \left(\frac{n - n_1}{r_1} + \frac{n_2 - n}{r_2}\right) \quad (9)$$

$$f' = \lim_{s \to \infty} s' = n_2 / \left(\frac{n - n_1}{r_1} + \frac{n_2 - n}{r_2}\right) \quad (10)$$

According to formulas (8) to (10), the following can be obtained:

$$\frac{f'}{s'} + \frac{f}{s} = 1 \quad (11)$$

Formula (11) gives the imaging formula of negative refractive index lens, which is completely consistent with Gaussian formula of imaging formula of positive refractive index thin lens, so that all imaging formulas of positive refractive index thin lens are applicable to negative refractive index thin lens.

In an exemplary embodiment of the present disclosure, the light emitting device layer of the display panel may further include: a hole injection layer, a hole transport layer and an electron transport layer, the hole injection layer is disposed at a side of the anode layer away from the thin film transistor circuit layer, the hole transport layer is disposed at a side of the hole injection layer away from the thin film transistor circuit layer, the emitting layer is disposed at a side away from the thin film transistor circuit layer, and the electron transport layer is disposed at a side of the emitting layer away from the thin film transistor circuit layer.

In an exemplary embodiment of the present disclosure, the light emitting device layer of the display panel may further include: at least one of an electron blocking layer, a hole blocking layer, and an electron injection layer; the electron blocking layer is disposed between the hole transport layer and the emitting layer, the hole blocking layer is disposed between the emitting layer and the electron transport layer, and the electron injection layer is disposed between the electron transport layer and the cathode layer.

In an exemplary embodiment of the present disclosure, the material of the anode layer may be a material with a high work function. For example, for top emission devices, the anode layer can adopt a composite structure of metal and transparent oxide, such as Ag/ITO (Indium Tin Oxide), Ag/IZO (Indium Zinc Oxide), Al/ITO, Al/IZO or ITO/Ag/ITO and the like, which can ensure good reflectivity.

In an exemplary embodiment of the present disclosure, the material of the hole injection layer may include transition metal oxides, for example, may include any one or more of molybdenum oxides, titanium oxides, vanadium oxides, rhenium oxides, ruthenium oxides, chromium oxides, zirconium oxides, hafnium oxides, tantalum oxides, silver oxides, tungsten oxides, manganese oxides.

In another exemplary embodiment, the material of the hole injection layer may include a p-type dopant of a strong electron absorption system and a hole transport material;

The p-type dopant includes any one or more of: 2, 3, 6, 7, 1011-hexocyano-1,4,5,8,9,12-hexaazabenzophenanthrene;

2,3,5,6-tetrafluoro-7,7',8,8'-tetracyano-p-benzoquinone; 1, 2, 3-tris[(cyano) (4-cyano-2,3,5,6-tetrafluorophenyl)methylene]cyclopropane.

The hole transport material may include any one or more of a arylamine hole transport material, a dimethylfluorene hole transport material, and a carbazole hole transport material; for example, the hole transport material may include any one or more of:
4,4'-bis[N-(1-naphthyl)-N-phenylamino]biphenyl(NPB);
N,N'-bis(3-methylphenyl)-N,N'-diphenyl-[1,1'-biphenyl]-4, 4'-diamine(TPD);
4-phenyl-4'-(9-phenylfluoren-9-yl)triphenylamine (BAFLP);
4,4'-bis[N-(9,9-dimethylfluoren-2-yl)-N-phenylamino]biphenyl(DFLDPBi);
4,4'-bis(9-carbazolyl)biphenyl benzene (CBP);
and 9-phenyl-3-[4-(10-phenyl-9-anthracenyl)phenyl]-9H-carbazole (PCzPA).

In an exemplary embodiment of the present disclosure, the hole injection layer may be formed by evaporation.

In an exemplary embodiment of the present disclosure, the material of the hole transport layer may include any one or more of an arylamine-based hole-transport material, a dimethylfluorene-based hole-transport material, a carbazole-based hole-transport material; for example, the material of the hole transport layer can include any one or more of:
4,4'-bis[N-(1-naphthyl)-N-phenylamino]biphenyl (NPB);
N, N'-bis(3-methylphenyl)-N, N'-diphenyl-[1,1'-biphenyl]-4,4'-diamine (TPD);
4-phenyl-4'-(9-benzene phenylfluoren-9-yl)triphenylamine (BAFLP);
4,4'-bis[N-(9,9-dimethylfluoren-2-yl)-N-phenylamino]biphenyl (DFLDPBi);
4,4'-bis(9-carbazolyl)biphenyl (CBP);
and 9-phenyl-3-[4-(10-phenyl-9-anthracenyl)phenyl]-9H-carbazole (PCzPA).

In an exemplary embodiment of the present disclosure, the hole transport layer may be formed by evaporation.

The material of the light-emitting layer can be a blue light-emitting material, which can include any one or more of blue light-emitting materials based on pyrene derivatives, blue light-emitting materials based on anthracene derivatives, blue light-emitting materials based on fluorene derivatives, and blue light-emitting materials based on perylene derivatives, styrylamine derivative-based blue light-emitting materials and metal complex-based blue luminescent materials; for example, the blue luminescent materials may include any one or more of:
N1,N6-bis([1,1'-biphenyl]-2-yl)-N1,N6-bis([1,1'-biphenyl]-4-yl)pyrene-1,6-diamine, 9,10-di-(2-naphthyl)anthracene (ADN);
2-methyl-9,10-di-2-naphthyl anthracene (MADN); 2,5,8,11-tetra-tert-butylperylene (TBPe);
4,4'-bis[4-(diphenylamino)styryl]biphenyl (BDAV Bi);
4,4'-bis[4-(diphenylamino)styryl]biphenyl benzene (DPAVBi);
bis(4,6-difluorophenylpyridine-C2, N)pyridinecarboyl iridium (FIrpic).

In an exemplary embodiment of the present disclosure, the material of the electron transport layer may include aromatic heterocyclic electron transport materials, for example, may include any one or more of electron transport materials based on benzimidazole and its derivatives, electron transport materials based on imidazopyridine and its derivatives, electron transport materials based o benzimidazolophenanthridine derivatives, electron transport materials based on pyrimidine and its derivatives, electron transport materials based on triazine derivatives, electron transport materials based on pyridine and its derivatives, electron transport materials based on pyrazine and its derivatives, electron transport materials based on quinoxaline and its derivatives, electron transport materials based on oxadiazole and its derivatives, electron transport materials based on quinoline and its derivatives, electron transport materials based on isoquinoline derivatives, electron transport materials based on phenanthroline derivatives, electron transport materials based on diazaphosphorole, electron transport materials based on phosphine oxide, electron transport materials based on aromatic ketone, lactams, electron transport materials based on boranes.

For another example, the material of the electron transport layer may include any one or more of:
2-(4-biphenyl)-5-(4-tert-butylphenyl)-1,3,4-oxadiazole (PBD);
1,3-bis[5-(p-tert-butylphenyl)-1,3,4-oxadiazole-2-yl]benzene (OXD-7);
3-(4-tert-butylphenyl)-4-phenyl-5-(4-biphenyl)-1,2,4-triazole (TAZ);
3-(4-tert-butylphenyl)-4-(4-ethylphenyl)-5-(4-biphenyl)-1, 2,4-triazole (p-EtTAZ);
red phenanthroline (BPhen);
(BCP);
4,4'-bis(5-methylbenzoxazol-2-yl)stilbene (BzOs).

In an exemplary embodiment of the present disclosure, the material of the electron blocking layer may include any one or more of arylamine-based electron-blocking materials, dimethylfluorene-based electron-blocking materials, and carbazole-based electron-blocking materials; for example, the material of the electron blocking layer may include any one or more of:
4,4'-bis[N-(1-naphthyl)-N-phenylamino]biphenyl (NPB);
N, N'-bis(3-methylphenyl)-N, N'-diphenyl-[1,1'-biphenyl]-4,4'-diamine (TPD);
4-phenyl-4'-(9-phenylfluoren-9-yl)triphenylamine (BAFLP);
4,4'-bis[N-(9,9-dimethylfluoren-2-yl)-N-phenylamino]biphenyl (DFLDPBi);
4,4'-bis(9-carbazolyl)biphenyl Benzene (CBP);
and 9-phenyl-3-[4-(10-phenyl-9-anthracenyl)phenyl]-9H-carbazole (PCzPA).

In an exemplary embodiment of the present disclosure, the electron blocking layer may be formed by evaporation.

In an exemplary embodiment of the present disclosure, the material of the hole blocking layer may include an aromatic heterocyclic hole blocking material, for example, may include any one or more of hole blocking materials based on benzimidazole and its derivatives, hole blocking materials based on imidazopyridine and its derivatives, hole blocking materials based on benzimidazophenanthridine derivatives, hole blocking materials based on pyrimidine and its derivatives, hole blocking materials based on triazine derivatives, hole blocking materials based on pyridine and its derivatives, hole blocking materials based on pyrazine and its derivatives, hole blocking materials based on quinoxaline and its derivatives, hole blocking materials based on oxadiazole and its derivatives, hole blocking materials based on quinoline and its derivatives, hole blocking materials based on isoquinoline derivatives, hole blocking materials based on phenanthroline derivatives, hole blocking materials based on diazaphosphorole, hole blocking materials based on phosphine oxide, hole blocking materials based on aromatic ketone, lactams, and hole blocking materials based on boranes.

For another example, the material of the hole blocking layer may include any one or more of:

2-(4-biphenyl)-5-(4-tert-butylphenyl)-1,3,4-oxadiazole (PBD);

1,3-bis[5-(p-tert-butylphenyl)-1,3,4-oxadiazole-2-yl]benzene (OXD-7);

3-(4-tert-butylphenyl)-4-phenyl-5-(4-biphenyl)-1,2,4-triazole (TAZ);

3-(4-tert-butylphenyl)-4-(4-ethylphenyl)-5-(4-biphenyl)-1,2,4-triazole (p-EtTAZ);

red phenanthroline (BPhen); (BCP); 4,4'-bis(5-methylbenzoxazol-2-yl)stilbene (BzOs).

In an exemplary embodiment of the present disclosure, the hole blocking layer may be formed by evaporation.

In exemplary embodiments of the present disclosure the material of the electron injection layer may include any one or more of an alkali metal electron injection material and a metal electron injection material.

For example, the electron injection layer material may include any one or more of LiF, Yb, Mg, Ca.

In an exemplary embodiment of the present disclosure, the electron injection layer may be formed by evaporation.

In an exemplary embodiment of the present disclosure, the cathode may be formed by the metal with relatively low work function, such as Al, Ag, and Mg, or formed by an alloy containing a metal material with a low work function.

In an exemplary embodiment of the present disclosure, the quantum dot material of the quantum dot conversion layer may be a cadmium-based material or a non-cadmium-based material, such as an InP or a perovskite material or the like; the scatter particles forming the scatter structure layer may be $TiO_2$ or the like.

Embodiments of the present disclosure further provide a display apparatus, including a plurality of display panels according to the embodiments of the present disclosure described above. The display apparatus may also include an integrated circuit (IC) for driving the display panel and a power supply circuit.

The display apparatus may be any product or part with a display function, such as a mobile phone, a tablet computer, a television, a display, a laptop computer, a digital photo frame, a navigator, a vehicle-mounted display, a smart watch, and a smart bracelet.

Although the implementation modes disclosed in the present disclosure are as above, the described contents are only implementation modes used for convenience of understanding the present disclosure and are not intended to limit the present disclosure. Any person skilled in the art of the present disclosure may make any modification and change in forms and details of implementation without departing from the spirit and scope disclosed in the present disclosure. However, the scope of patent protection of the present disclosure is still subject to the scope defined in the appended claims.

The invention claimed is:

1. A display panel, has a plurality of repeated pixel units, and at least one pixel unit comprises a first sub-pixel, a second sub-pixel and a third sub-pixel displaying different colors, wherein the display panel includes:

a first base substrate;

a light emitting device layer located at a side of the first base substrate, wherein the light emitting device layer comprises a first light emitting device, a second light emitting device and a third light emitting device, the first light emitting device is located in the first sub-pixel, the second light emitting device is located in the second sub-pixel, the third light emitting device is located in the third sub-pixel, and the light emitting device layer comprises an anode layer, an emitting layer, a cathode layer and a pixel definition layer;

a thin film encapsulation layer located at a side of the light emitting device layer away from the first base substrate;

a color filter layer located at a side of a color conversion layer away from the first base substrate, at least comprising a first light shielding pattern, a first color filter pattern and a second color filter pattern, wherein the first light shielding pattern defines a plurality of light transmitting areas, and the light transmitting areas comprise a first light transmitting area corresponding to the first sub-pixel, a second light transmitting area corresponding to the second sub-pixel and a third light transmitting area corresponding to the third sub-pixel;

the color conversion layer located between the light emitting device layer and the color filter layer, wherein the color conversion layer comprises a first color conversion pattern located in the first sub-pixel, a second color conversion pattern located in the second sub-pixel and a transmission pattern located in the third sub-pixel; and a filler layer located between the light emitting device layer and the color conversion layer, wherein the filler layer comprises a matrix having a positive refractive index and a plurality of optical patterns having a negative refractive index.

2. The display panel according to claim 1, wherein the thin film encapsulation layer is positioned at a side of the light emitting device layer close to the color conversion layer, and includes a first encapsulation layer, a second encapsulation layer and a third encapsulation layer which are sequentially stacked along a direction close to the first base substrate, wherein the first encapsulation layer and the third encapsulation layer are inorganic encapsulation layers and the second encapsulation layer is an organic encapsulation layer, wherein the material of the first encapsulation layer has a positive refractive index; the optical pattern has a side surface in direct contact with the matrix.

3. The display panel according to claim 2, wherein the optical pattern has a first surface and a second surface connected with the side surface, the second surface is parallel to a plane where the first base substrate is located and is in direct contact with the matrix.

4. The display panel according to claim 3, wherein the first surface is parallel to the plane where the first base substrate is located and is in direct contact with the matrix.

5. The display panel according to claim 3, wherein the first surface is parallel to the plane where the first base substrate is located, and the first surface of the optical pattern is located at a side of the optical pattern close to the first base substrate, and the first surface of the optical pattern is in direct contact with a surface at a side of the first encapsulation layer away from the first base substrate.

6. The display panel according to claim 1, wherein a plurality of the optical patterns are sequentially arranged along a first direction and extend along a second direction, and the first direction intersects with the second direction.

7. The display panel according to claim 1, wherein a plurality of the optical patterns are arranged in an array in the filler layer.

8. The display panel according to claim 6, wherein orthographic projection areas of the first light transmitting area, the second light transmitting area, and the third light transmitting area in the filler layer are each provided with at least one optical pattern.

9. The display panel according to claim 6, wherein the optical pattern comprises a first optical pattern, a second optical pattern, an orthographic projection of the first optical pattern on the first base substrate is substantially overlapped with an orthographic projection of the first light transmitting area on the first base substrate, and an orthographic projection of the second optical pattern on the first base substrate is substantially overlapped with an orthographic projection of the second light transmitting area on the first base substrate.

10. The display panel according to claim 9, wherein the optical pattern further comprises a third optical pattern, an orthographic projection of the third optical pattern on the first base substrate is substantially overlapped with an orthographic projection of the third light transmitting area on the first base substrate.

11. The display panel according to claim 10, wherein a color of a sub-pixel of the third light transmitting area is the same as a color of light emitted by a light emitting device of the light emitting device layer.

12. The display panel according to claim 1, wherein the first light emitting device, the second light emitting device and the third light emitting device emit the same color.

13. The display panel according to claim 1, wherein a thickness of the optical pattern along a direction perpendicular to the first base substrate is less than a maximum thickness of the filler layer along the direction perpendicular to the first base substrate.

14. The display panel according to claim 3, wherein the thickness of the optical pattern is calculated by the following formula:

$$1/f = (n-1)[1/L1 - 1/L2 + (n-1)d/nL1L2] \quad (1)$$
$$1/f = 1/u + 1/v \quad (2)$$
$$d = dv + du \quad (3)$$
$$u = du + dEML + dTFE \quad (4)$$
$$v = dfiller + dv \quad (5)$$

where d is the thickness of the optical pattern;
f is a focal length; n is a refractive index of the optical pattern;
L1 and L2 are lengths of a long edge and a short edge of the optical pattern respectively;
u is an object distance;
v is an image distance;
dv is a distance from a light convergence point in the optical pattern to the second surface of the optical pattern along the direction perpendicular to the first base substrate;
du is a distance from the light convergence point in the optical pattern to the first surface of the optical pattern along the direction perpendicular to the first base substrate;
dEML is a distance from a center of the emitting layer to a surface at a side of the thin film encapsulation layer close to the first base substrate along the direction perpendicular to the first base substrate;
dTFE is a thickness of the thin film encapsulation layer;
dfiller is a distance between the second surface at a side of the optical pattern away from the first base substrate and a surface at a side of the color conversion layer close to the first base substrate.

15. The display panel according to claim 14, wherein the refractive index of the optical pattern is 1 to 4.

16. The display panel according to claim 14, wherein f is 5 to 15.

17. The display panel according to claim 14, wherein u is 7 to 30 and v is 7 to 30; and/or L1 is 20 to 300, and L2 is 20 to 300.

18. The display panel according to claim 1, wherein a center position of the emitting layer is located in a first plane parallel to the first base substrate, and a distance from a surface of the pixel definition layer away from the first base substrate to the first plane along the direction perpendicular to the first base substrate is not less than 200 nm.

19. The display panel according to claim 1, wherein the pixel definition layer comprises a plurality of sub-pixel definition layers, the plurality of sub-pixel definition layers at least comprises a first sub-pixel definition layer and a second sub-pixel definition layer, and the second sub-pixel definition layer is disposed at a side of the first sub-pixel definition layer away from the first base substrate.

20. A display apparatus, comprising the display panel according to claim 1.

* * * * *